(12) United States Patent
Miller et al.

(10) Patent No.: US 8,428,899 B2
(45) Date of Patent: Apr. 23, 2013

(54) APPARATUS FOR TESTING A CONDUCTED ENERGY WEAPON

(76) Inventors: Mark Edward Miller, Vancouver (CA); Ronald William Evans, Delta (CA)

( * ) Notice: Subject to any disclaimer, the term of this patent is extended or adjusted under 35 U.S.C. 154(b) by 825 days.

(21) Appl. No.: 12/583,029

(22) Filed: Aug. 12, 2009

(65) Prior Publication Data

US 2011/0040515 A1 Feb. 17, 2011

(51) Int. Cl.
*G01R 27/28* (2006.01)

(52) U.S. Cl.
USPC ........................................................ 702/117

(58) Field of Classification Search .................... 702/117
See application file for complete search history.

(56) References Cited

U.S. PATENT DOCUMENTS

| | | |
|---|---|---|
| 6,801,045 B2 | 10/2004 | Hamm et al. |
| 6,924,648 B2 | 8/2005 | Altmann et al. |
| 7,102,870 B2 | 9/2006 | Nerheim |
| 7,471,092 B2 | 12/2008 | Amanuma et al. |

OTHER PUBLICATIONS

Braidwood Commission, Restoring Public Confidence: Restricting the use of Conducted Energy Weapons, Gov't BC, Victoria BC Canada.
Palmer, Testing of Conducted Energy Weapons, CPRC, Ottawa Ontario Canada.
Nerheim, RE: National Technology Systems (NTS) testing (correspondence), Dec. 2, 2008, Taser International Inc., Scottsdale AZ.
Savard et al, Analysis of the Quality and Safety of the Taser X26 Devices tested for Radio-Canada . . . , Dec. 2, 2008, Canadian Broadcasting Corp.
Sinclair, Taser Model X26 Test Concepts, Jan. 22, 2009, MPB Technologies Inc., Ottawa Ontario Canada.
Sinclair, Test Results for the M26 Conducted Energy Weapon, May 25, 2009, MPB Technologies Inc., Ottawa Ontario Canada.
Sinclair, Test Results for the X26 Conducted Energy Weapon, Apr. 6, 2009, MPB Technologies Inc., Ottawa Ontario Canada.

*Primary Examiner* — Stephen Cherry

(57) ABSTRACT

Apparatus for testing a conducted energy weapon includes analyzer to produce characteristic signals representative of characteristics of electrical current pulses delivered by the weapon into a resistive load when the weapon is discharged. Risk estimation device responsive to the characteristic signals produces a risk estimate representative of a risk of injury to a targeted subject due to electrical stimulation, or alternatively representative of a risk of failure to incapacitate the targeted subject. Indicator device responsive to the risk estimate indicates the risk of injury, or alternatively the risk of failure to incapacitate, and warns the user of the apparatus when the risk exceeds a predetermined threshold.

10 Claims, 7 Drawing Sheets

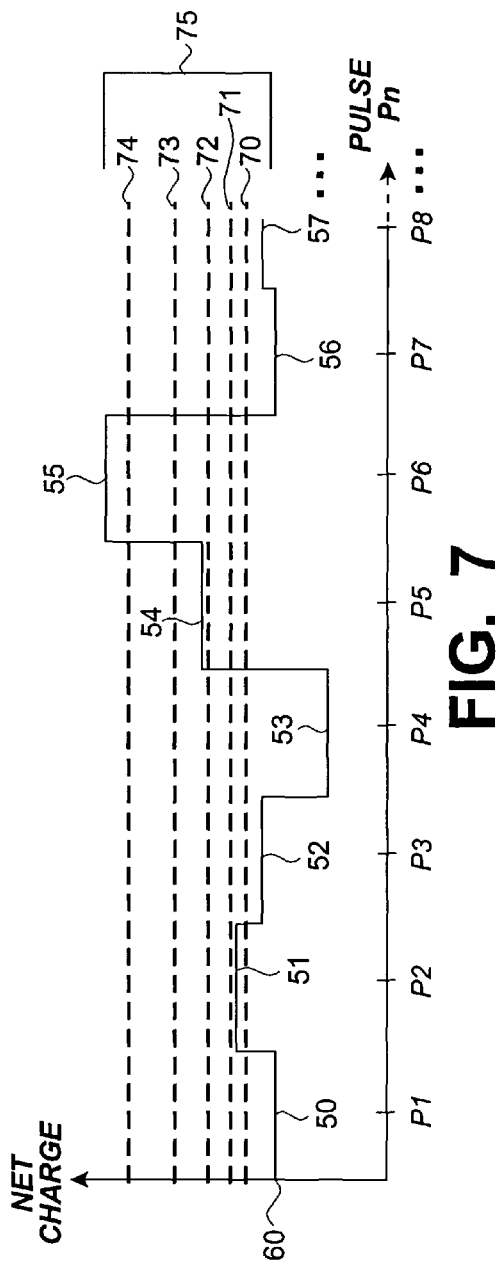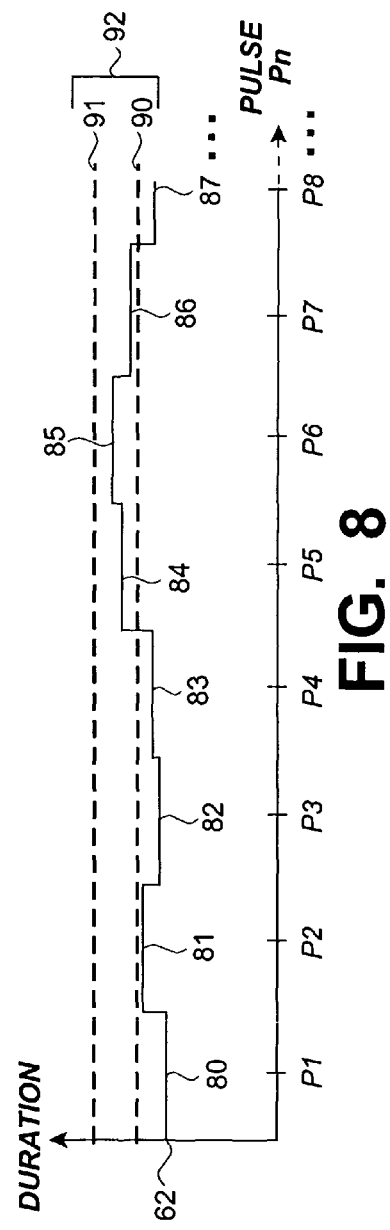

APPARATUS FOR TESTING A CONDUCTED ENERGY WEAPON

FIELD OF THE INVENTION

The present invention relates to conducted energy weapons, and more particularly, to means for testing the efficacy and safety of such weapons.

BACKGROUND OF THE INVENTION

A conducted energy weapon (CEW), variously known as an electronic disabling device, an electronic control device, or a "stun gun", incapacitates a targeted subject by delivering a sequence of high voltage pulses to the skin by means of a pair of electrodes. Current which flows between the electrodes stimulates the target's neuromuscular system to produce involuntary muscle contractions, thereby disabling the subject. Depending on CEW design, the electrodes may contact the skin through direct application of the weapon to the subject's body, or by means of darts launched from the weapon which then penetrate the clothing of the target to reach the skin.

In law enforcement, a CEW may be used by a peace officer for subduing a combative person in a scenario where application of significant but non-lethal restraining force is necessary to secure safety of the peace officer and potentially the public. Although a CEW is intended to be non-lethal, deaths have occurred in a limited number of cases where such weapons have been used. Although specific cause of death may be difficult to identify, an underlying medical or drug-induced condition in combination with a delirious mental state can be contributors to an outcome known to forensic science as "sudden death following restraint" (SDFR). To what extent CEW use may have contributed to fatality in SDFR cases is controversial, and such controversy raises concern in the general public regarding safety of the weapons and the perceived risks of their use.

A scenario which has received less public attention but is of significant concern to law enforcement agencies is a situation in which a CEW is discharged but fails to incapacitate the intended target. Such failure will arise in the case of a missed target, resulting in poor or no electrical contact from one or both projectile darts to the skin of the intended victim. In cases where evidence of effective electrode contact can be verified, a negative outcome may then be attributable to reduced performance or malfunction of the weapon.

Public concerns over safety and perceived risks of CEWs have prompted law enforcement agencies to internally conduct or to commission laboratory-based studies of CEWs. To assist such agencies with their investigations, a leading manufacturer of CEWs has provided a document illustrating the recommended test methods. In summary, the manufacturer's tests include use of an oscilloscope and accessory probes to observe output current delivered by the weapon to a specified resistive load, and to observe peak sparking voltage developed across a high-impedance probe. Such methods are limited in that they require significant technical expertise in setup and use of the apparatus. More importantly, since CEW operation fundamentally relies on generation of spark discharges across one or more air gaps internal to the weapon, CEW signals as displayed by an oscilloscope may be corrupted by impulse artifacts, thus requiring significant skill on the part of the user of the apparatus to discern the true characteristics of the CEW signal from the superimposed impulse noise.

Performed in accordance with such testing instructions provided by the CEW manufacturer, one study conducted at the Canadian Police Research Center (CPRC) produced discrepant results which were later uncovered and questioned in a television news report produced by the Canadian Broadcasting Corporation (CBC). Additionally, the CBC report went further to describe a subsequent independent laboratory investigation performed at National Technical Systems (NTS), which found three CEWs out of a sample of 44 which failed to produce any output, and four weapons which produced output which was 47-58% higher than specified by the manufacturer. CEW tests performed by another commercial laboratory found 96 out of 122 TASER® M26 weapons tested failed to meet one or more of the manufacturer's performance specifications, causing the government which commissioned the laboratory tests to remove the weapons from police service. These negative results demonstrate a need exists to periodically test CEWs to guarantee that weapons in use are, at minimum, operating within manufacturer-specified limits.

Following an incident at the Vancouver International Airport in October 2007, in which Robert Dziekanski died after receiving several shocks from a CEW discharged by an officer of the Royal Canadian Mounted Police (RCMP), a strong and international public reaction ensued when an amateur video of the incident became widely seen on television and the Internet. In February 2008, the government of British Columbia commissioned retired justice Thomas Braidwood Q.C. to inquire into and report on the use of CEWs by law enforcement agencies operating within the province. After receiving presentations on CEWs from numerous experts with medical, engineering, law enforcement and commercial backgrounds, the Braidwood Commission issued a report to the BC provincial government in June 2009 specifying nineteen recommendations on CEW usage, including requirements for periodic testing of electrical output from all CEWs in use, and in particular, testing of any CEW involved in an incident where there is significant injury or death.

In response to public pressure, law enforcement agencies such as the RCMP have acknowledged the Braidwood recommendations and have initiated processes to adopt them. Compliance places significant economic and logistic burdens on such agencies, who must either internally develop the required technical resources and engineering competence to perform the recommended tests, or alternatively solicit costly testing services from external laboratories.

A limitation of CEW tests performed by government research and commercial laboratories is that specialist knowledge and experience is required to set up the necessary experiments and to correctly interpret signals which may be corrupted by impulse interference as previously described. *High Voltage Test Techniques* by Dieter Kind and Kurt Feser (ISBN 0750651830) is a reference text which will be familiar to persons skilled in the arts of electrical engineering or physics, and in particular, to those having an interest in experimental measurement of hazardous voltages and electrical currents such as would be encountered in testing a CEW. Apparatus and methods as taught by Kind and Feser are not suitable for use by peace officers or other personnel who may be associated with a law enforcement agency, and who may have limited understanding of high-voltage engineering and little or no training in the use of related laboratory apparatus and techniques.

A further limitation of CEW tests performed by government research and commercial laboratories is that the tests are entirely focussed on CEW conformance to the manufacturer's performance specifications. In such tests, a CEW is considered acceptable for use if all tested parameters fall within corresponding limits specified by the weapon manufacturer. However, as reported in the scientific literature and summarized in the first report published by the Braidwood Commission, there exists a growing body of scientific evidence to indicate that there may be a non-zero risk of fatal cardiac arrhythmia that may result from stimulation produced by a "normal" CEW. On the other hand, a CEW which marginally exceeds minimum specified performance levels in several tested parameters may be acceptable for use by definition, however, risk of failure to subdue a combative individual may be greater compared to a CEW having all tested parameters well within their respective acceptance ranges. These considerations motivate a superior metric for CEW acceptability based on estimated risk of an adverse outcome such as injury or death of the targeted subject due to electrical stimulation, or alternatively failure of the weapon to deliver sufficient stimulation to incapacitate the subject, rather than acceptability based on simple conformance to specified limits of performance.

To summarize the limitations described above, the prior art does not provide apparatus or method which will permit an individual who is not skilled in the art of high-voltage engineering and related laboratory technique, such as a peace officer, to measure and analyze the electrical output of a conducted energy weapon and in so doing derive an estimate of the risk of electrically stimulating a targeted subject to the point of serious injury or death.

Furthermore, the prior art does not provide apparatus or method which would permit a non-technical individual, such as a peace officer, to measure and analyze the electrical output of a conducted energy weapon and in so doing derive an estimate of the risk of failing to sufficiently stimulate a targeted subject to achieve incapacitation. The prior art does not provide machine-based automation which would permit a non-technical individual, such as a peace officer, to make such technical and analytical determinations rapidly and easily, and in a way which is non-hazardous for the officer concerned.

To address concerns of the general public in regard to CEW safety, an object of the present invention is to provide apparatus for testing a CEW, the apparatus including analyzer means to produce characteristic signals representative of characteristics of electrical current pulses delivered by the weapon into a resistive load when the weapon is discharged, where such characteristics include peak values, durations, and instantaneous frequencies of the pulses, and integrated areas of the pulses which thereby represent net electric charge. Risk estimation means compares each characteristic signal to corresponding thresholds representing increasing severity of harm due to electrical stimulation. By counting the number of times a characteristic signal exceeds a corresponding threshold, the risk estimation means thereby produces an estimate of the risk of injury to a targeted subject due to electrical stimulation. Indicator means displays the risk of injury and warns the user when the risk exceeds a predetermined threshold.

To address concerns of law enforcement in regard to CEW efficacy as a weapon, a further object of the present invention is to provide apparatus for testing a CEW, the apparatus including analyzer means to produce characteristic signals representative of characteristics of electrical current pulses delivered by the weapon into a resistive load. Risk estimation means compares each characteristic signal to corresponding thresholds representing decreasing levels of incapacitation of a targeted subject. By counting the number of times a characteristic signal falls below a corresponding threshold, the risk estimation means thereby produces an estimate of the risk of CEW failure to incapacitate the subject. Indicator means displays the risk of CEW failure to incapacitate and warns the user when the risk exceeds a predetermined threshold.

Advantageously, automated machine-based testing and risk analysis provided by the invention allows weapon tests to be easily and routinely conducted by non-technical persons having no knowledge of electrical principles, laboratory testing methods or risk analysis methodologies, such persons including peace officers or other individuals who may be associated with a law enforcement agency.

SUMMARY OF THE INVENTION

The invention is directed toward apparatus for testing a conducted energy weapon, comprising: receptacle means for connecting a set of terminals on the conducted energy weapon to a resistive load; sensor means for producing a load signal representative of electrical current pulses delivered from the set of terminals to the resistive load when the conducted energy weapon is discharged; analyzer means responsive to the load signal for producing a plurality of characteristic signals representative of characteristics of the electrical current pulses; risk estimation means responsive to the plurality of characteristic signals for producing a risk estimate representative of a risk of injury to a targeted subject due to an electrical stimulation imparted by the conducted energy weapon; and indicator means responsive to the risk estimate for indicating the risk of injury to the targeted subject, and for indicating that the risk of injury has exceeded a predetermined threshold. The plurality of characteristic signals may include signals representative of peak values, durations, instantaneous frequencies, and integrated areas of the electrical current pulses. The risk estimation means produces the risk estimate by: selecting, from the plurality of characteristic signals, each characteristic signal in turn; comparing each characteristic signal to a corresponding set of predetermined thresholds representing graduated severities of harm due to an electrical stimulation; and incrementing the risk estimate in each instance where a characteristic signal exceeds a threshold of the corresponding set of predetermined thresholds.

The invention is further directed toward apparatus for testing a conducted energy weapon, comprising: receptacle means for connecting a set of terminals on the conducted energy weapon to a resistive load; sensor means for producing a load signal representative of electrical current pulses delivered from the set of terminals to the resistive load when the conducted energy weapon is discharged; analyzer means responsive to the load signal for producing a plurality of characteristic signals representative of characteristics of the electrical current pulses; risk estimation means responsive to the plurality of characteristic signals for producing a risk estimate representative of a risk of failure to incapacitate a targeted subject by delivery of an electrical stimulation from the conducted energy weapon; and indicator means responsive to the risk estimate for indicating the risk of failure to incapacitate the targeted subject, and for indicating that the risk of failure has exceeded a predetermined threshold. The plurality of characteristic signals may include signals representative of peak values, durations, instantaneous frequencies, and integrated areas of the electrical current pulses. The risk estimation means produces the risk estimate by: selecting, from the plurality of characteristic signals, each characteristic signal in turn; comparing each characteristic signal to a corresponding set of predetermined thresholds representing graduated levels of incapacitation; and incrementing the risk estimate in each instance where a characteristic signal falls below a threshold of the corresponding set of predetermined thresholds.

BRIEF DESCRIPTION OF THE DRAWINGS

FIG. 7 is a waveform diagram schematically illustrating comparison of the characteristic signal of FIG. 6 to a corresponding set of predetermined thresholds representing graduated severities of harm due to an electrical stimulation.

FIG. 8 is a waveform diagram schematically illustrating comparison of a characteristic signal representing pulse duration to a corresponding set of predetermined thresholds representing graduated severities of harm due to an electrical stimulation.

DESCRIPTION OF THE PREFERRED EMBODIMENT

The embodiment illustrated herein is not intended to be exhaustive or to limit the invention to the precise form disclosed. It is chosen and described in order to explain the principles of the invention, and its application and practical use, and thereby enable others skilled in the art to utilize the invention.

Figure 1:
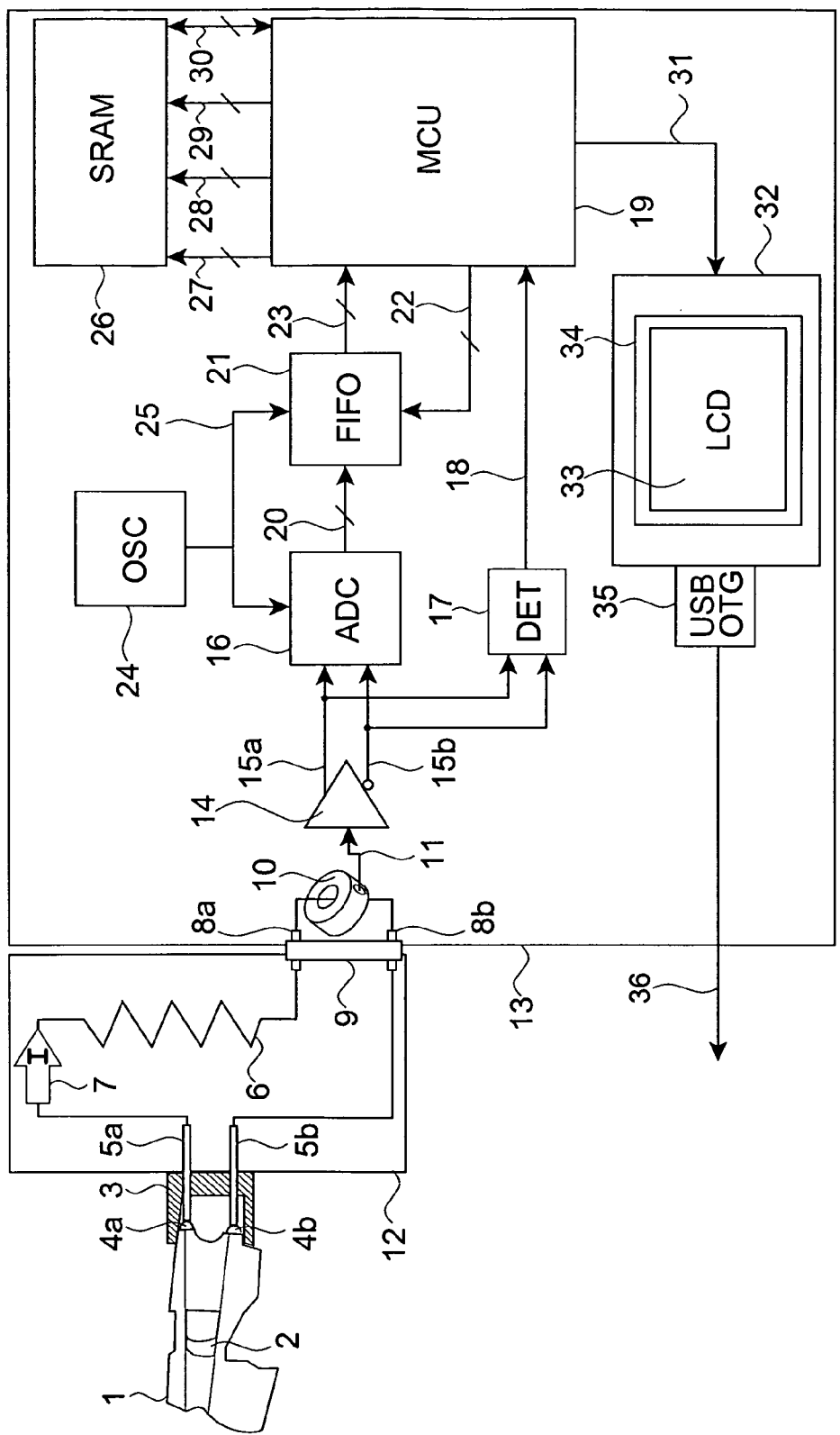
FIG. 1 is a schematic block diagram of apparatus for testing a conducted energy weapon.
Figure 2:
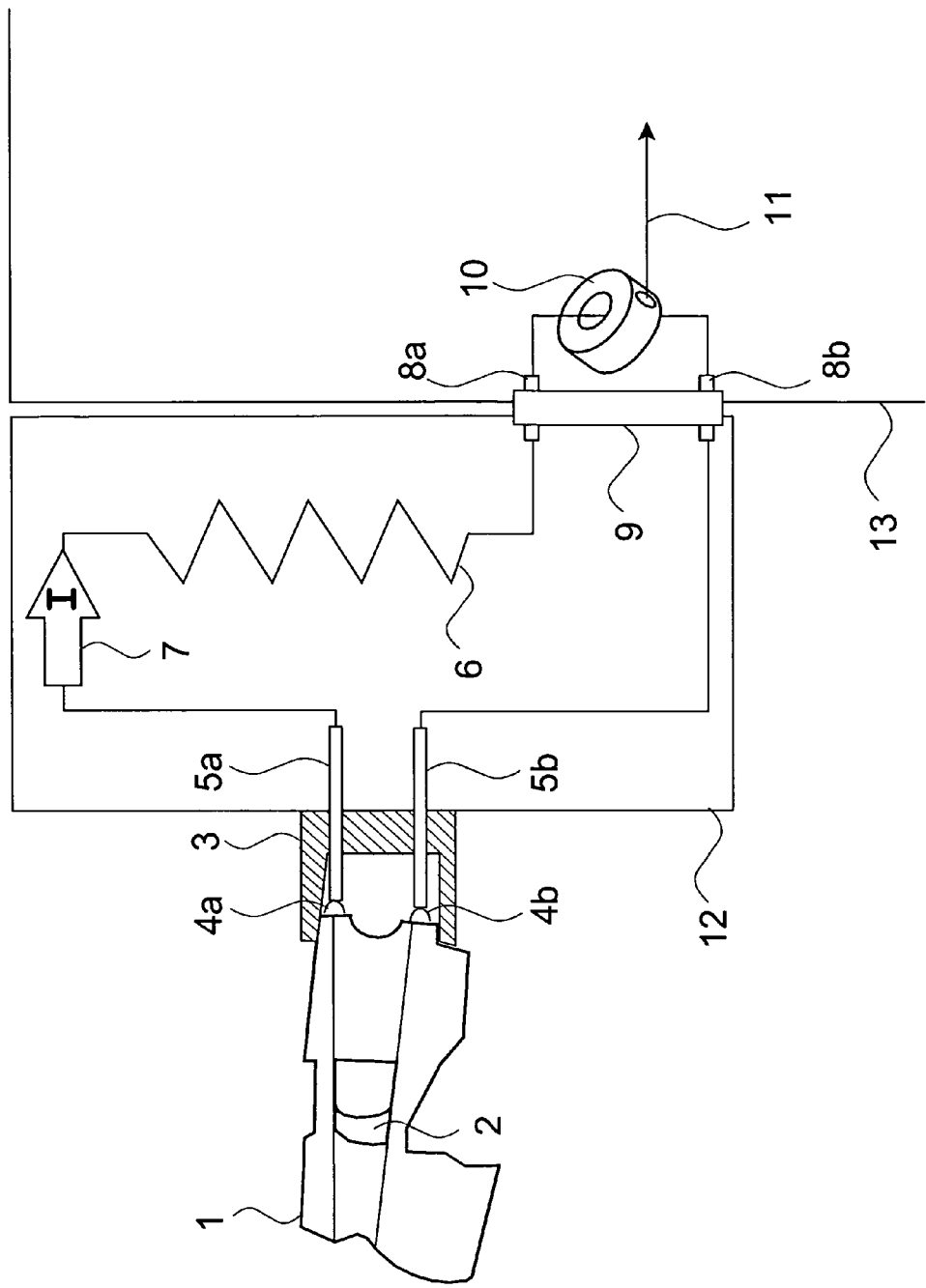
FIG. 2 is a schematic block diagram illustrating details of the conducted energy weapon, a weapon receptacle, and a resistive load of the apparatus.

Apparatus for testing a conducted energy weapon 1 appears in the block diagram of FIG. 1, with specific details of weapon 1 being identified in FIG. 2. Referring to FIGS. 1 and 2, a conducted energy weapon 1 providing trigger 2 is inserted into receptacle 3, where a set of terminals 4a and 4b on weapon 1 connect to a resistive load 6 by means of spring-loaded contacts 5a and 5b. When trigger 2 of weapon 1 is actuated by a user of the apparatus, such as a peace officer, weapon 1 generates electrical current pulses 7 which are delivered from terminal 4a to one end of resistive load 6 as indicated in FIGS. 1 and 2. Via pin 8a of interface connector 9, electrical current pulses 7 pass through the center of toroidal current sensor 10 and return via pin 8b of connector 9 and contact 5b of receptacle 3 to terminal 4b of weapon 1. Thereby, sensor 10 produces load signal 11 representative of electrical current pulses 7 when weapon 1 is discharged. According to FIGS. 1 and 2, the apparatus includes Faraday shield 12 surrounding resistive load 6, and Faraday shield 13 surrounding the remainder of the apparatus to prevent interference electromagnetically radiated by weapon 1 from reaching sensor 10 and thereby corrupting load signal 11 when weapon 1 is discharged.

Referring to FIG. 1, load signal 11 is conditioned by differential amplifier 14 to produce balanced output signals 15a and 15b which are respectively conveyed to analog-to-digital converter (ADC) 16. Balanced output signals 15a and 15b are also conveyed to the inputs of pulse detector (DET) 17, which outputs trigger signal 18 to microcontroller (MCU) 19 of the apparatus. Parallel conversion data 20 produced by ADC 16 is conveyed to first-in first-out (FIFO) memory 21, which variably buffers conversion data 20 for MCU 19 according to read/write control signals 22 output by MCU 19. Data stored in FIFO 21 is read by MCU 19 via FIFO data outputs 23 in response to read/write control signals 22 from MCU 19. Crystal oscillator 24 generates clock signal 25 which is conveyed to ADC 16 and FIFO 21, allowing conversion data 20 to be synchronously clocked into FIFO 21 and stored for subsequent read-out by MCU 19 via data outputs 23 according to control signals 22.

In a working model of the preferred embodiment assembled according to FIG. 1, the frequency of oscillator 24 is 25 Megahertz and the capacity of FIFO 21 is 4096 words of conversion data 20 as produced by ADC 16, where each word may arbitrarily comprise 12 to 16 binary bits depending on particular specifications of the component chosen for ADC 16. Given the specified frequency of oscillator 24 and capacity of FIFO 21, FIFO 21 can thus store a maximum of 163.84 microseconds of sampled data, which is sufficient to represent with high fidelity the waveform of one pulse of load signal 11 as observed during discharge of weapon 1. When weapon 1 is activated by trigger 2, however, weapon 1 will generate many electrical current pulses 7, typically on the order of nineteen pulses per second over a nominal five-second discharge time, and as such pulses 7 will all be represented in load signal 11. A limitation of prior art, for example an oscilloscope, when used to test a conducted energy weapon is that only a single pulse produced during a discharge is recorded by the apparatus. This limitation is overcome in the present invention by static random-access memory (SRAM) 26, under control of MCU 19 via bank-select signals 27, address signals 28, read/write signals 29, and data bus 30. In operation of the apparatus as described in further detail below, MCU 19 uses signals 27, 28 and 29 to transfer 4096 words of conversion data 20 as stored by FIFO 21 to SRAM 26 via data bus 30. This data transfer takes place during the nominal fifty-millisecond interval between each pulse of pulses 7, during which time load signal 11 is substantially equal to zero. In a working model of the preferred embodiment assembled according to FIG. 1, SRAM 26 provides a capacity of 256 kilobytes, sufficient to store up to 32 blocks of 4096 words as transferred from FIFO 21, each block corresponding to 163.84 microseconds of sampled data as derived by ADC 16 from load signal 11.

Upon completion of a discharge of weapon 1, MCU 19 automatically analyzes data stored in SRAM 26 to derive characteristic signals representative of characteristics of electrical current pulses 7, these characteristics including peak values and durations of pulses 7, along with additional characteristics which will be described below. The characteristic signals derived by MCU 19 are conveyed via serial communications link 31 to embedded computing module 32, incorporating liquid crystal display (LCD) 33 which is integrated with transparent touchscreen 34. Computing module 32 also provides USB on-the-go (OTG) port 35, which is used in transferring report documentation data 36 derived from the testing results to externally-connected systems.

A preferred embodiment of apparatus for testing a conducted energy weapon may be assembled according to FIGS. 1 and 2 by persons skilled in the art as follows: resistive load 6 comprises two Ayrton-Perry wirewound resistors connected in series, said resistors being type UTN-300 ohm-1% manufactured by Riedon of Alhambra Calif.; current sensor 10 is type 411 manufactured by Pearson Electronics of Palo Alto Calif.; amplifier 14 is LMH6551 manufactured by National Semiconductor of Santa Clara Calif.; detector 17 is comprised of two analog comparators, type LMV7219 manufactured by National Semiconductor; ADC 16 is type LTC2227, manufactured by Linear Technology of Milpitas Calif.; MCU 19 is type C8051F132, manufactured by Silicon Laboratories of Austin Tex.; FIFO 21 is type SN74V245, manufactured by Texas Instruments of Dallas Tex.; oscillator 24 is type ASFLM1-25 manufactured by Abracon Corporation of Rancho Santa Margarita Calif.; SRAM 26 is type CY7C1010DV33, manufactured by Cypress Semiconductor of San Hose Calif.; and embedded computing module 32 is EM-X270 manufactured by Compulab of Haifa Israel.

Operation of the preferred embodiment according to FIGS. 1 and 2 will now be described. In operation of the apparatus, LCD 33 of computing module 32 displays instructions to a peace officer or other law enforcement personnel utilizing the apparatus, and when necessary or desired, computing module 32 accepts data entry from the user by means of touchscreen 34. To begin a test, LCD 33 displays instructions requesting the peace officer to insert weapon 1 into receptacle 3. Accordingly, the peace officer inserts weapon 1 into receptacle 3 until weapon 1 stops, indicating contact has been achieved between terminals 4a and 4b of weapon 1 and spring contacts 5a and 5b respectively. Thereby, receptacle means provided by receptacle 3 connects a set of terminals 4a and 4b on conducted energy weapon 1 to resistive load 6.

While waiting for the peace officer to discharge weapon 1, MCU 19 by means of read/write controls 22 causes FIFO 21 to repetitively buffer 125 words of conversion data 20 as produced by ADC 16. Since ADC 16 and FIFO 21 are synchronously clocked by oscillator 24 at a rate of 25 MHz, FIFO 21 thereby continuously and repetitively buffers 5 microseconds of sampled data corresponding to load signal 11, prior to reception of trigger signal 18 by MCU 19.

According to instructions displayed on LCD 33, the peace officer discharges weapon 1 in receptacle 3 by actuating trigger 2, causing electrical current pulses 7 to flow through resistive load 6 and sensor 10 by means of the circuit shown in FIG. 1. Sensor 10 thereby produces load signal 11 representative of electrical current pulses 7 delivered from a set of terminals 4a and 4b to resistive load 6.

Figure 3:
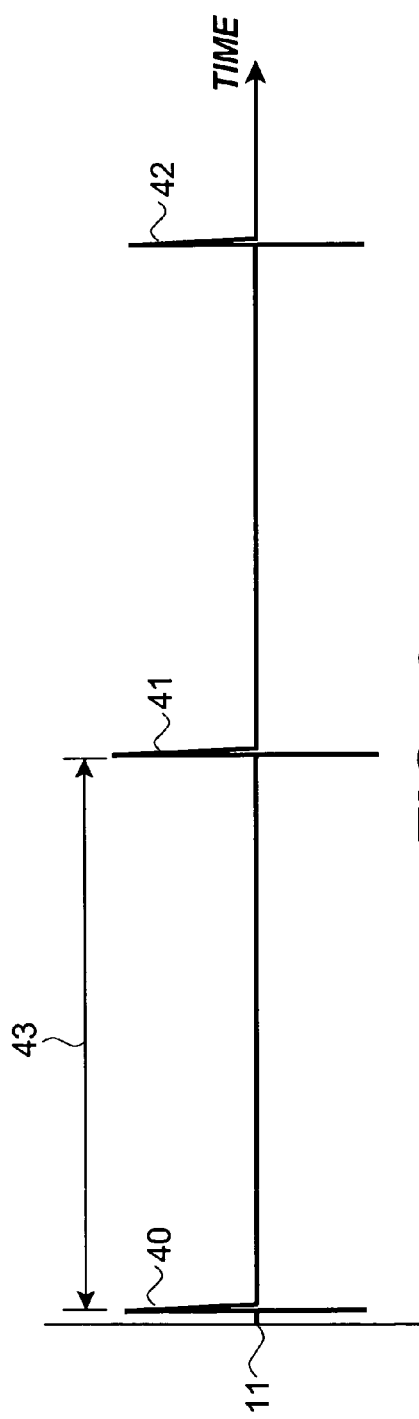
FIG. 3 is a waveform diagram illustrating a load signal representing three out of approximately one-hundred electrical current pulses caused by discharge of a conducted energy weapon into a resistive load.
Figure 4:
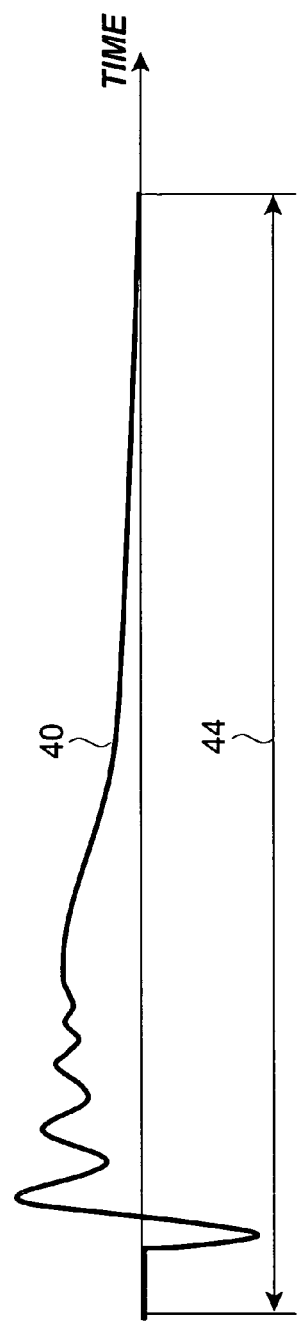
FIG. 4 is a waveform diagram illustrating one of the pulses shown in FIG. 3, but as represented on an expanded time scale.

FIG. 3 is a waveform diagram illustrating three example pulses 40, 41 and 42 of the waveform of load signal 11, with pulse 40 in particular being selected for illustration in FIG. 4 on an substantially expanded time scale (vertical scales in FIG. 3 and FIG. 4 are equal and represented in arbitrary units of measure). As described earlier, once weapon 1 is activated by trigger 2, weapon 1 may then generate approximately one-hundred electrical current pulses 7 over the course of a five-second discharge. Accordingly, pulse interval 43 of FIG. 3 will be nominally 50 milliseconds and total pulse length 44 as indicated in FIG. 4 will range from approximately 40 to 150 microseconds for a typical conducted energy weapon.

Referring to FIGS. 1 and 3, pulse 40 of load signal 11 is conditioned by amplifier 14 to produce a corresponding differential pulse at balanced output signals 15a and 15b which are conveyed to the input of pulse detector (DET) 17. In response to a differential pulse at output signals 15a and 15b, DET 17 produces trigger signal 18 to interrupt MCU 19. As previously described, prior to receipt of trigger signal 18, MCU 19 produces read/write controls 22 causing FIFO 21 to repetitively and continuously buffer 125 words of conversion data 20 from ADC 16. Upon receipt of trigger signal 18 from DET 17, MCU 19 produces read/write controls 22 such that FIFO 21 stops repetitively buffering and instead stores conversion data 20 continuously until completely filled with 4096 words of sampled data, at which point FIFO 21 automatically stops storing. At this point, FIFO 21 contains a digitized representation of pulse 40 shown in FIG. 4. In the working model of the preferred embodiment, the digitized representation of pulse 40 comprises 4096 words of sample data spanning 163.84 microseconds along the time axis of FIG. 4. Additionally, and in response to trigger signal 18, MCU 19 resets and enables an internal timer, allowing MCU 19 to measure pulse interval 43 of load signal 11 as shown in FIG. 3.

Referring to FIG. 1, after receiving trigger signal 18 and while waiting for FIFO 21 to fill, MCU 19 delays approximately 170 microseconds. After this delay, MCU 19 activates read/write controls 22 to read out the sampled data stored in FIFO 21 via data outputs 23. Each sample datum from FIFO 21 is copied by MCU 19 to a corresponding location in SRAM 26 as respectively selected by bank signals 27 and address signals 28, and as conveyed from MCU 19 to SRAM 26 by means of data bus 30 under control of read/write signals 29. After each sample datum is copied, address signals 28 are incremented by MCU 19 to select the next location in SRAM 26, while bank select signals 27 are left unchanged. Copying of sample data from FIFO 21 to SRAM 26 is completed during the interval following pulse 40 and prior to pulse 41, during the time which load signal 11 is substantially equal to zero as indicated in FIG. 3.

Referring back to FIG. 1, once all sample data has been read from FIFO 21 and written to a designated bank of SRAM 26 according to signals 27, MCU 19 restores the original state of read/write controls 22 so that FIFO 21 returns to repetitively and continuously buffering 125 words of conversion data 20 from ADC 16. MCU 19 then proceeds to wait for another trigger signal 18, representative of subsequent pulse 41 as shown in FIG. 3. The internal timer of MCU 19 continues to measure pulse interval 43 until DET 17 produces a trigger signal 18 representing detection of pulse 41. In response to trigger signal 18, MCU 19 internally records the measured pulse interval 43, delays 170 microseconds, and then proceeds to copy the sample data stored in FIFO 21 to SRAM 26 after first incrementing bank select signals 27.

The foregoing process of digitizing pulses of load signal 11 via ADC 16 and moving the sample data from FIFO 21 to designated bank areas in SRAM 26 is repeated by MCU 19 for pulse 42 and subsequent pulses generated by weapon 1 over the course of the discharge. While digitizing and recording the pulses of load signal 11, which are representative of electrical current pulses 7, LCD 33 of embedded computing module 32 displays a progress bar graph to indicate the progress of the data acquisition phase of the test to the user.

Data acquisition proceeds as described until either SRAM 26 is full or until the internal timer of MCU 19, which clocks the time intervals between pulses of load signal 11, exceeds a predetermined maximum count, indicating that weapon 1 has terminated its discharge. Upon termination of the discharge, SRAM 26 contains sampled data representations of a number of pulses comprising load signal 11, each pulse representation being similar to the example waveform of FIG. 4, and the number of pulse representations acquired being determined in part by the duration of the discharge from weapon 1 and in part by the capacity of SRAM 26. Additionally, memory of MCU 19 also contains a plurality of time intervals, said intervals being obtained from an internal timer controlled by MCU 19 in response to trigger signal 18 and being representative of the time interval between pulses of load signal 11, for example, pulse period 43 between pulse 40 and pulse 41 as shown in FIG. 3. To summarize the foregoing operations, by means of data acquisition hardware comprising amplifier 14, oscillator 24, ADC 16, FIFO 21 and SRAM 26, MCU 19 acquires digitized representations of the pulses comprising load signal 11, where load signal 11 is representative of electrical current pulses 7 delivered from terminals 4a and 4b of weapon 1 to resistive load 6 when weapon 1 is discharged.

Upon termination of the data acquisition phase, MCU 19 automatically proceeds to the data analysis phase of the test. During analysis, LCD 33 of embedded computing module 32 displays an indication of analysis progress to the user. Referring to FIGS. 1, 3, 4, and 5, such analysis is illustrated for the specific case of pulse 40, which is stored in SRAM 26 as digitized pulse 45. MCU 19 calculates integrated area 50 under digitized pulse 45 and thereby obtains a value representing a net electric charge delivered by pulse 40 to resistive load 6. This procedure is repeated for each digitized pulse stored in SRAM 26, and thereby MCU 19 derives a characteristic signal representing net electric charges delivered by the pulses comprising electrical current pulses 7. This is indicated in the example of FIG. 6, which shows net charge signal 60 in part comprised of integrated areas 50 through 57, said areas being respectively derived by MCU 19 through analysis of digitized pulse 45 and additional digitized pulses as stored in SRAM 26.

Figure 5:
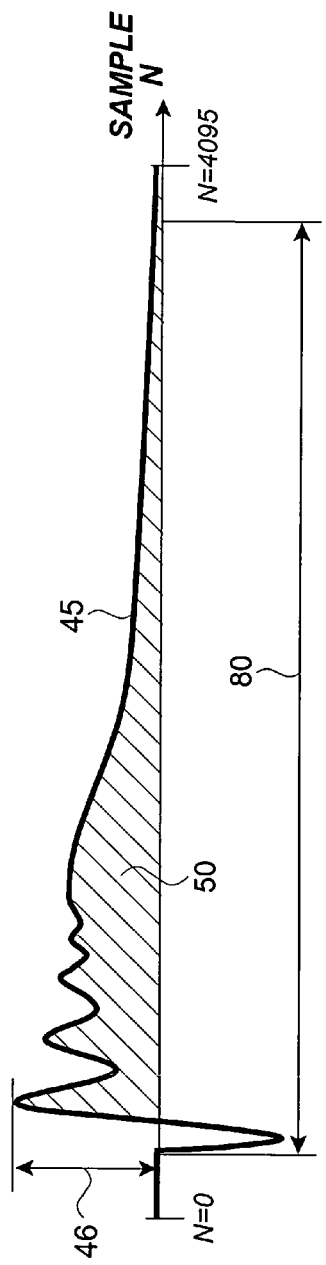
FIG. 5 is a waveform diagram illustrating a digitized pulse corresponding to the pulse shown in FIG. 4, and additionally the peak value of the digitized pulse, the duration of the digitized pulse, and the integrated area under the digitized pulse which thereby represents net electric charge.
Figure 6:
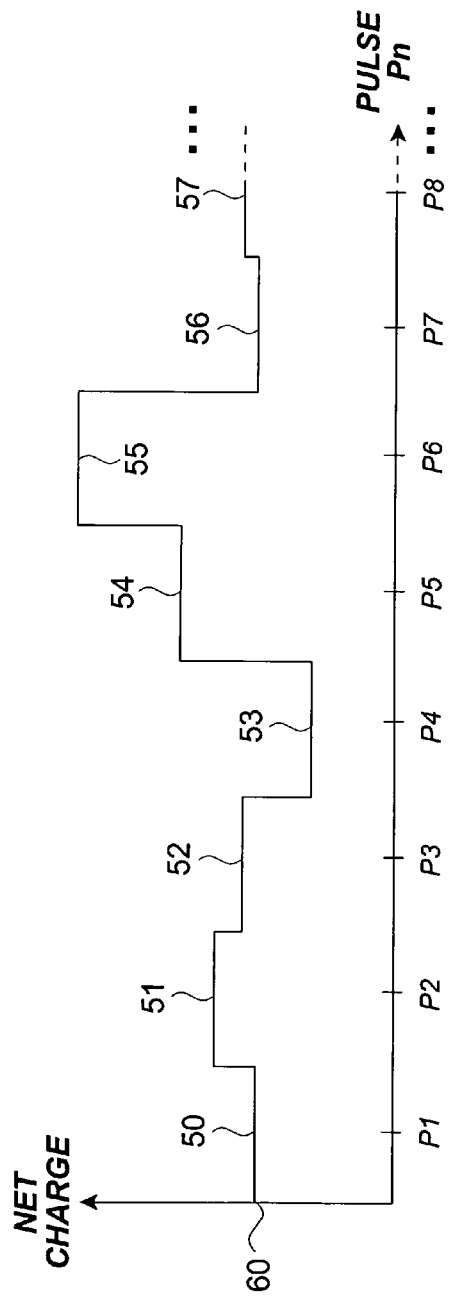
FIG. 6 is a waveform diagram illustrating a characteristic signal representative of the net electric charge output by a conducted energy weapon.

Upon determining integrated area 50 of digitized pulse 45, MCU 19 searches the sampled data of digitized pulse 45 to locate the largest datum, indicated in FIG. 5 by peak value 46. This procedure is repeated for each digitized pulse stored in SRAM 26, and thereby MCU 19 derives an amplitude signal representative of the peak values of pulses comprising electrical current pulses 7.

Upon finding peak value 46 of digitized pulse 45, MCU 19 measures the length of digitized pulse 45 from the first negative-going signal excursion to a point at which the pulse amplitude falls below one-percent of peak value 46, this length being indicated in FIG. 5 by duration 80 of digitized pulse 45. This procedure is repeated for each digitized pulse stored in SRAM 26, and thereby MCU 19 derives a duration signal representative of the durations of pulses comprising electrical current pulses 7. This is indicated in the example of FIG. 8, which shows duration signal 62 in part comprised of durations 80 through 87, said durations being respectively derived by MCU 19 through analysis of digitized pulse 45 and additional digitized pulses as stored in SRAM 26. Note FIG. 8 shows features in addition to duration signal 62 which will be explained later in the description of risk estimation as performed by the apparatus.

Upon determining duration 80 of digitized pulse 45, MCU 19 inverts the time interval between digitized pulse 45 and an immediately subsequent pulse stored in SRAM 26, said time interval being represented in FIG. 3 as pulse period 43 between pulse 40 and pulse 41 of load signal 11, and pulse period 43 having been measured by MCU 19 and stored in the memory of MCU 19 during the data acquisition phase of the test as previously described. Inversion of pulse period 43 results in an instantaneous frequency value which is assigned to pulse 40 of FIG. 3, and thereby is assigned to digitized pulse 45 of FIG. 6. Said inversion is repeated by MCU 19 for all time intervals stored in the memory of MCU 19, and thereby MCU 19 derives an instantaneous frequency signal representative of inverted time intervals between electrical current pulses 7.

In summary of the foregoing, MCU 19 provides analyzer means responsive to load signal 11 for producing a plurality of characteristic signals representative of characteristics of electrical current pulses 7, wherein the plurality of characteristic signals includes an amplitude signal representative of peak values of electrical current pulses 7, one example of said peak values being peak value 46 of FIG. 5; a duration signal, for example duration signal 62 of FIG. 8, representative of durations of electrical current pulses 7; an instantaneous frequency signal representative of inverted time intervals between electrical current pulses 7, one example of said time intervals being pulse period 43 of FIG. 3; and a net charge signal, for example net charge signal 60 of FIG. 6, representative of net electric charges delivered by electrical current pulses 7, one example of said net electric charges being integrated area 50 of FIG. 5.

The foregoing characteristic signals derived by the analyzer means of MCU 19 are represented in digital form in the memory of MCU 19. Once derived, MCU 19 transmits the characteristic signal data via serial communications link 31 to embedded computing module 32, where the data are then stored in the memory of computing module 32. Computing module 32 then proceeds with the risk estimation phase of the test.

The underlying principles of risk estimation as embodied in the invention will now be described. The risks of two scenarios are of interest: (a) that weapon 1 of FIG. 1 imparts an electrical stimulation of intensity sufficient to cause injury or death of a targeted subject; and (b) that weapon 1 fails to impart an electrical stimulation of intensity sufficient to cause incapacitation of the subject. The invention is concerned with risk of injury to a subject only as a direct cause of an electrical stimulation from weapon 1; potential secondary outcomes, for example a puncture wound from a projected barb of a conducted energy weapon, or outcomes which may precipitate an injury, for example a fall leading to a concussion, are outside the scope of risk estimation embodied by the apparatus. Death or serious injury directly attributable to electrical stimulation from a CEW have yet to be observed in humans, however, scientific evidence from animal and limited human studies currently exists to indicate CEWs have a capacity to induce ventricular fibrillation; myocardial infarction; stroke; respiratory impairment; and additional adverse effects, and that such effects can be induced in normal healthy subjects as well as subjects who may be predisposed to such effects by an underlying medical or drug-induced condition.

Accordingly, a CEW which outputs a greater level of electrical stimulation, primarily through delivery of a larger net charge per pulse of electrical current, and to a somewhat lesser extent by a higher pulse current, duration, or repetition frequency, can be expected to have a higher risk of injury than a CEW which exhibits lower and more normative values in these electrical characteristics. On the other hand, a minimum electrical stimulation is necessary in order to produce the desired incapacitation of the subject. Therefore, a CEW which produces a lower level of electrical stimulation, as represented in a lower net charge per pulse, or to a lesser extent a lower pulse current, duration, or repetition frequency, can be expected to have a higher risk of failure to incapacitate than a CEW which exhibits higher and more normative values in these electrical characteristics.

Another aspect of risk estimation embodied in the invention relates to a basic principle found in many forms of risk analyses, one example of which is risk analysis as outlined in Annex E of the ISO-14971 standard, *Application of Risk Management to Medical Devices*. In estimating risk, it is necessary to consider the probability of a negative outcome, which can be alternatively expressed as a frequency of occurrence of that outcome, in combination with the consequences of the outcome, which can be expressed as a level of severity of harm. When estimating risk of injury to a targeted subject, severity of harm due to electrical stimulation is represented in the present invention by means of a set of predetermined thresholds against which characteristic signals representative of electrical current pulses are compared; the remaining aspect of risk, this being frequency of occurrence, is represented through a counting system which accumulates the number of instances that said thresholds are exceeded by characteristic signals. A similar but converse method, based on predetermined thresholds representative of graduated levels of incapacitation due to an electrical stimulation and on a counting system which accumulates the number of instances that characteristic signals fall below said thresholds, is applied to estimation of risk of failure to incapacitate a targeted subject. Operation of the invention for both methods of risk estimation will now be described in detail below.

FIG. 7 illustrates net charge signal 60, signal 60 being included in the plurality of characteristic signals produced by the analyzer means of MCU 19 of FIG. 1 according to methods previously described. Integrated areas 50 through 57 of net charge signal 60, along with additional integrated areas not represented in FIG. 7, are numeric data which are conveyed from MCU 19 via serial communications link 31 of FIG. 1 to embedded computing module 32. In its memory, computing module 32 maintains a software-based counter, and upon receipt of the characteristic signal data from MCU 19, computing module 32 resets this risk counter equal to zero. Referring to FIG. 7, thresholds 70, 71, 72, 73 and 74 comprise a set of predetermined thresholds 75 corresponding to net charge, and representative of graduated severities of harm due to an electrical stimulation. Computing module 32 compares net charge signal 60 to the corresponding set of predetermined thresholds 75 and increments the risk counter by one count in each instance where net charge signal 60 exceeds a threshold 70, 71, 72, 73 or 74 of the set of predetermined thresholds 75. In the example of FIG. 7, the risk counter of computing module 32 is initially incremented from zero to one as a result of integrated area 51 exceeding threshold 70; and is then incremented by three as a result of integrated area 54 exceeding thresholds 70, 71, and 72 inclusive; and is then incremented by five as a result of integrated area 55 exceeding thresholds 70, 71, 72, 73 and 74 inclusive. Thereby, the risk counter of computing module 32 attains a value of ten counts according to the example of FIG. 7. This process is repeated for all integrated area values comprising net charge signal 60.

FIG. 8 illustrates pulse duration signal 62, signal 62 being included in the plurality of characteristic signals produced by the analyzer means of MCU 19 of FIG. 1 according to methods previously described. Durations 80 through 87 of duration signal 60, along with additional duration values not represented in FIG. 8, are numeric data which are conveyed from MCU 19 via serial communications link 31 of FIG. 1 to embedded computing module 32. Referring to FIG. 8, thresholds 90 and 91 comprise a set of predetermined thresholds 92 corresponding to duration, and representative of graduated severities of harm due to an electrical stimulation. Computing module 32 compares duration signal 62 to the corresponding set of predetermined thresholds 92 and increments the risk counter by one count in each instance where duration signal 62 exceeds threshold 90 or threshold 91 of the corresponding set of predetermined thresholds 92. In the example of FIG. 8, the risk counter of computing module 32 is incremented by one count as a result of duration 84 exceeding threshold 90; by one count as a result of duration 85 exceeding threshold 90; and by one count as a result of duration 86 exceeding threshold 90. Thereby, the risk counter of computing module 32 has now attained a total value of thirteen counts according to the examples of FIG. 7 and FIG. 8 in combination.

The foregoing process of accordingly updating the risk counter is repeated by computing module 32 for all duration values comprising duration signal 62, and through similar processes, for all characteristic signals and corresponding sets of predetermined thresholds which are compared by computing module 32 during the risk estimation. The resulting risk count is then displayed to the user by means of LCD 33 of FIG. 1. Optionally, computing module 32 may compare the risk count to a predetermined threshold corresponding a normal level of risk, such a level being a count of twenty for example, and display a warning by means of LCD 33 in the event that the risk count exceeds this threshold. Based on the risk of injury indicated by LCD 33, the user may choose to keep weapon 1 in active service or alternatively remove weapon 1 from service in the event that the risk is abnormally high.

Until scientific evidence is obtained which conclusively establishes a relationship between electrical stimulation output by a CEW and injury in human subjects, normative values for an existing CEW may be used to define preliminary or investigative sets of predetermined thresholds representative of graduated severities of harm. TABLE I lists performance specifications for the TASER® X26E Electronic Control Device manufactured by Taser International of Scottsdale Ariz.; these values are intended to represent the full range of manufacturing variation for this weapon.

TABLE I

| Performance specifications for TASER ® X26E | |
|---|---|
| Pulse duration (microseconds): | 105 to 155 |
| Pulse peak value (amperes): | 2.3 to 4.2 |
| Pulse frequency (Hertz): | 16.5 to 20 |
| Pulse charge (microcoulombs): | 80 to 125 |

For testing of TASER® X26E, the specifications of TABLE I may be expanded into sets of predetermined thresholds representative of graduated severities of harm according to TABLE II. Comparing TABLE I and TABLE II, thresholds are included in TABLE II which exceed maximum values specified by Taser International for TASER® X26E. For example, the pulse charge threshold of 195 microcoulombs appearing in TABLE II, corresponding to charge threshold 74 shown in FIG. 7, is more than 50% higher than the maximum possible output specified in TABLE I by the manufacturer of TASER® X26E.

TABLE II

Risk estimation thresholds related to injury

|  | Threshold: | | | | |
| --- | --- | --- | --- | --- | --- |
|  | A | B | C | D | E |
| Pulse duration (microseconds): | 140 | 160 | | | |
| Pulse peak value (amperes): | 3.6 | 4.2 | 5.7 | | |
| Pulse frequency (Hertz): | 20 | 30 | | | |
| Pulse charge (microcoulombs): | 115 | 125 | 135 | 155 | 195 |

Note the threshold values appearing in TABLE II are arbitrary and are for purposes of illustrating the present invention only; the values in TABLE II are not meant to imply that a TASER® X26E exhibiting characteristics which exceed these thresholds will, if used, certainly result in serious injury or death of a targeted subject. Rather, an object of the present invention is to indicate to a non-technical user, such as a peace officer, that a TASER® X26E exhibiting characteristics which frequently exceed the thresholds of TABLE II will have a higher risk of injuring a targeted subject than a TASER® X26E which never exceeds any of the thresholds of TABLE II.

In review of the foregoing method of risk estimation, it will be apparent to persons skilled in the art that the basic requirements of estimating a risk have been met: that sets of predetermined thresholds, for example set 75 of FIG. 7 and set 92 of FIG. 8, provide the necessary quantification of severity of harm due to electrical stimulation; and that the risk counter of computing module 32 provides the necessary means to quantify probability or frequency of occurrence of a harmful electrical stimulation. According to the examples of FIGS. 7 and 8, it will also be evident to persons skilled in the art that the risk estimation method as disclosed inherently incorporates weighting of characteristic signals representative of electrical current pulses 7: the potential influence of net charge on calculation of the risk estimate, in which the risk counter may be incremented by up to five counts for each integrated area comprising net charge signal 60 per FIG. 7, is two and one-half times greater than the potential influence of pulse duration on calculation of the risk estimate, since pulse duration can at most contribute two counts to the risk counter for each duration comprising duration signal 62 per FIG. 8. This follows from the fact that neuromuscular stimulation is more dependent on delivery of pulsed electric charge to muscle tissue, and less dependant on pulse current or pulse duration considered as separate variables.

To summarize operation of the invention as described, and referring to FIGS. 1, 7 and 8, analyzer means provided by MCU 19 of FIG. 1 is responsive to load signal 11 and produces a plurality of characteristic signals representative of characteristics of electrical current pulses 7, examples of said characteristic signals being net charge signal 60 of FIG. 7, duration signal 62 of FIG. 8, and additional characteristic signals as described earlier. Via communications link 31, MCU 19 transmits characteristic signal data to computing module 32 which provides risk estimation means responsive to the plurality of characteristic signals for producing a risk estimate representative of a risk of injury to a targeted subject due to an electrical stimulation imparted by the conducted energy weapon, where in the preferred embodiment this risk estimate is provided by a software-based risk counter maintained in the memory of computing module 32. LCD 33 provides indicator means responsive to the risk estimate for indicating the risk of injury to the targeted subject, and for optionally indicating that the risk of injury to the target subject has exceeded a predetermined threshold. Computing module 32 produces the risk estimate by: selecting, from the plurality of characteristic signals, net charge signal 60 and each additional characteristic signal in turn; comparing each characteristic signal to a corresponding set of predetermined thresholds, for example the set of predetermined thresholds 75 of FIG. 7, representative of graduated severities of harm due to an electrical stimulation; and incrementing the risk estimate in each instance where a characteristic signal exceeds a threshold of the corresponding set of predetermined thresholds, an example of such an instance being integrated area 51 of net charge signal 60 exceeding threshold 70 of the set of predetermined thresholds 75.

Figure 9:
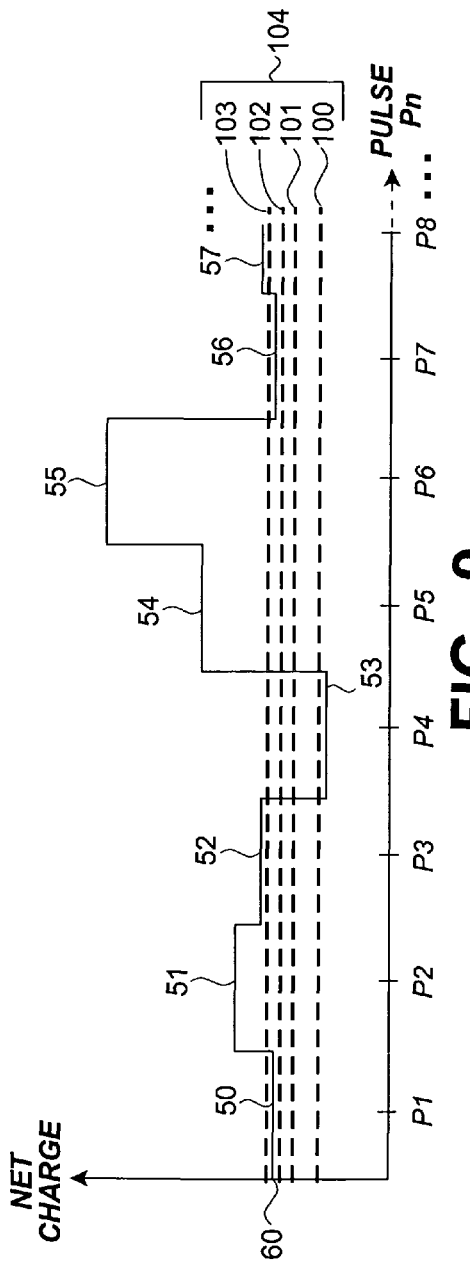
FIG. 9 is a waveform diagram schematically illustrating comparison of the characteristic signal of FIG. 6 to a corresponding set of predetermined thresholds representing graduated levels of incapacitation due to an electrical stimulation.

The apparatus of FIG. 1 may also be used in testing a CEW to determine the risk of failing to produce sufficient electrical stimulation to incapacitate a targeted subject. FIG. 9 illustrates net charge signal 60, signal 60 being included in the plurality of characteristic signals produced by the analyzer means of MCU 19 of FIG. 1 according to methods previously described. In its memory, computing module 32 maintains a software-based counter, and upon receipt of the characteristic signal data from MCU 19, computing module 32 resets this risk counter equal to zero. Referring to FIG. 9, thresholds 100, 101, 102, and 103 comprise a set of predetermined thresholds 104 corresponding to net charge, and representative of graduated levels of incapacitation due to an electrical stimulation. Computing module 32 compares net charge signal 60 to the corresponding set of predetermined thresholds 104 and increments the risk counter by one count in each instance where net charge signal 60 falls below a threshold 100, 101, 102, or 103 of the set of predetermined thresholds 104. In the example of FIG. 9, the risk counter of computing module 32 is initially incremented from zero to one as a result of integrated area 50 falling below threshold 100; and is then incremented by four as a result of integrated area 53 falling below thresholds 100, 101, 102, and 103 inclusive; and is then incremented by one as a result of integrated area 56 falling below threshold 100. Thereby, the risk counter of computing module 32 attains a value of six counts according to the example of FIG. 9. This process is repeated for all integrated area values comprising net charge signal 60.

Figure 10:
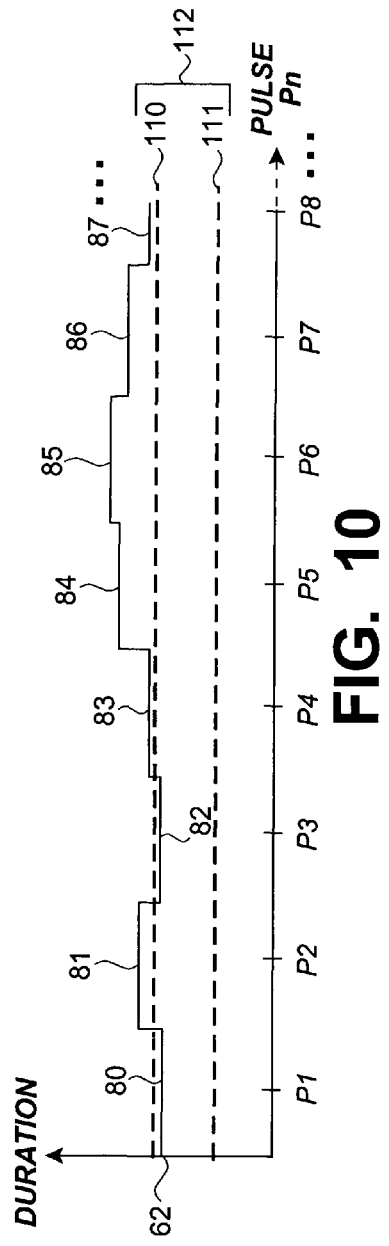
FIG. 10 is a waveform diagram schematically illustrating comparison of a characteristic signal representing pulse duration to a corresponding set of predetermined thresholds representing graduated levels of incapacitation due to an electrical stimulation.

FIG. 10 illustrates pulse duration signal 62, signal 62 being included in the plurality of characteristic signals produced by the analyzer means of MCU 19 of FIG. 1 according to methods previously described. Referring to FIG. 10, thresholds 110 and 111 comprise a set of predetermined thresholds 112 corresponding to duration, and representative of graduated levels of incapacitation due to an electrical stimulation. Computing module 32 compares duration signal 62 to the corresponding set of predetermined thresholds 112 and increments the risk counter by one count in each instance where duration signal 62 falls below threshold 110 or threshold 111 of the corresponding set of predetermined thresholds 112. In the example of FIG. 10, the risk counter of computing module 32 is incremented by one count as a result of duration 80 falling below threshold 110; and by one count as a result of duration 82 falling below threshold 110. Thereby, the risk counter of computing module 32 has now attained a total value of eight counts according to the examples of FIG. 9 and FIG. 10 in combination.

The foregoing process of accordingly updating the risk counter is repeated by computing module 32 for all duration values comprising duration signal 62, and through similar processes, for all characteristic signals and corresponding sets of predetermined thresholds which are compared by computing module 32 during the risk estimation. The resulting risk count is then displayed to the user by means of LCD 33 of FIG. 1. Optionally, computing module 32 may compare the risk count to a predetermined threshold corresponding a normal level of risk, such a level being a count of ten for example, and display a warning by means of LCD 33 in the event that the risk count exceeds this threshold. Based on the risk of failure to incapacitate as indicated by LCD 33, the user may choose to keep weapon 1 in active service or alternatively remove weapon 1 from service in the event that the risk is abnormally high.

For testing of TASER® X26E, the specifications listed TABLE I may be expanded into sets of predetermined thresholds representative of graduated levels of incapacitation according to TABLE III. Comparing TABLE I and TABLE III, thresholds are included in TABLE III which are less than minimum values specified by Taser International for TASER® X26E. For example, the pulse charge threshold of 55 microcoulombs appearing in TABLE III, corresponding to charge threshold 100 shown in FIG. 9, is less than 70% of the minimum possible output specified by the manufacturer for TASER® X26E. Note the values appearing in TABLE III are arbitrary and are for purposes of illustrating the present invention only; the values in TABLE III are not meant to imply that a TASER® X26E exhibiting characteristics which fall below these thresholds will, if used, certainly result in a failure to incapacitate a targeted subject. Rather, an object of the present invention is to indicate to a non-technical user, such as a peace officer, that a TASER® X26E exhibiting characteristics which frequently fall below the thresholds of TABLE III will have a higher risk of failure to incapacitate a targeted subject than a TASER® X26E which always exceeds all of the thresholds of TABLE III.

TABLE III

Risk estimation thresholds related to failure to incapacitate

| | Threshold: | | | |
|---|---|---|---|---|
| | A | B | C | D |
| Pulse duration (microseconds): | 85 | 105 | | |
| Pulse peak value (amperes): | 1.4 | 1.8 | 2.3 | |
| Pulse frequency (Hertz): | 12 | 17 | | |
| Pulse charge (microcoulombs): | 55 | 70 | 80 | 90 |

To summarize operation of the invention as described, and referring to FIGS. 1, 9 and 10, analyzer means provided by MCU 19 of FIG. 1 is responsive to load signal 11 and produces a plurality of characteristic signals representative of characteristics of electrical current pulses 7, examples of said characteristic signals being net charge signal 60 of FIG. 9, duration signal 62 of FIG. 10, and additional characteristic signals as described earlier. Via communications link 31, MCU 19 transmits characteristic signal data to computing module 32 which provides risk estimation means responsive to the plurality of characteristic signals for producing a risk estimate representative of a risk of failure to incapacitate a targeted subject by delivery of an electrical stimulation from the conducted energy weapon, where in the preferred embodiment this risk estimate is provided by a software-based risk counter maintained in the memory of computing module 32. LCD 33 provides indicator means responsive to the risk estimate for indicating the risk of failure to incapacitate a targeted subject, and for optionally indicating that the risk of failure has exceeded a predetermined threshold. Computing module 32 produces the risk estimate by: selecting, from the plurality of characteristic signals, net charge signal 60 and each additional characteristic signal in turn; comparing each characteristic signal to a corresponding set of predetermined thresholds, for example the set of predetermined thresholds 104 of FIG. 9, representative of graduated levels of incapacitation due to an electrical stimulation; and incrementing the risk estimate in each instance where a characteristic signal falls below a threshold of the corresponding set of predetermined thresholds, an example of such an instance being integrated area 50 of net charge signal 60 falling below threshold 100 of the set of predetermined thresholds 104.

The intended user of the invention, being a peace officer or other individual associated with a law enforcement agency, is not expected to be knowledgeable of electrical principles or skilled in application of electrical laboratory techniques. Furthermore, acquisition of meaningful test results is dependent on correct connection of the conducted energy weapon to the apparatus, where affirmative electrical contact of the weapon to the apparatus with correct polarity is necessary. Additionally, testing will involve generation of high voltages which present a shock hazard to the user. To simplify the electrical connections required for testing and eliminate the hazard of accidental shock to the user during a test, the preferred embodiment of the invention incorporates a receptacle as illustrated in FIG. 11.

Figure 11:
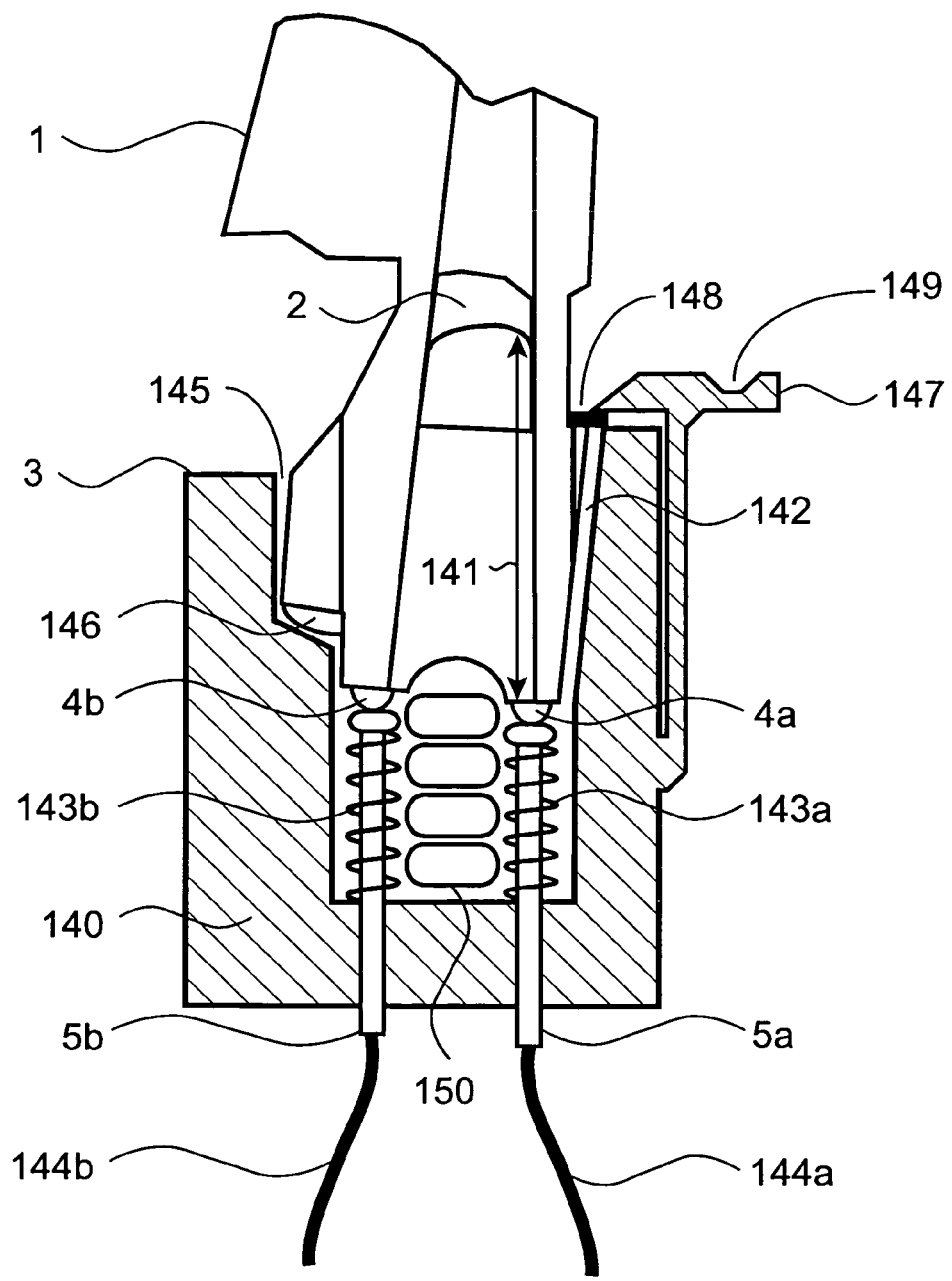
FIG. 11 is a pictorial representation of a receptacle suitable for providing a safe and reliable electrical connection between the output terminals of a conducted energy weapon and an electrical test instrument.

Referring to FIG. 11 and FIG. 1, receptacle 3 provides insulating body 140 which is constructed of a material having dielectric strength sufficient to withstand the high voltages encountered during testing of conducted energy weapon 1. Muzzle 141, being an area on weapon 1 bounded by trigger 2 at one end and terminal 4a at the other end as indicated in FIG. 14, fits snugly into recess 142 within body 140, recess 142 being formed to precisely accommodate the shape of muzzle 141. Body 140 incorporates contacts 5a and 5b which are placed under tension by springs 143a and 143b respectively, and which are connected to lead wires 144a and 144b respectively. Thereby, contacts 5a and 5b together with lead wires 144a and 144b comprise connection means for providing an electrically conductive path from terminals 4a and 4b of weapon 1 to an electrical test instrument, for example, testing apparatus as shown in FIG. 1. Tensioning means provided by springs 143a and 143b apply a force to achieve contact between terminals 4a and 4b and contacts 5a and 5b when weapon 1 is inserted by the user into receptacle 3.

With weapon 1 inserted into receptacle 3 as shown in FIG. 11, insulating body 140 substantially encloses terminals 4a and 4b of weapon 1 to protect the user from electrical shock, and the snug fit provided by recess 142 with muzzle 141 optimally aligns terminals 4a and 4b with contacts 5a and 5b respectively, so that the resulting electrical connection has minimum resistance. Additionally, recess 145 in body 140, being formed to accept the shape of lamp 146 on weapon 1, orients weapon 1 such that terminal 4a specifically connects to contact 5a, and terminal 4b specifically connects to contact 5b. Thereby, orientation means provided by recess 145 prevents reverse-insertion of weapon 1 resulting in an incorrect cross-connection of terminal 4a to contact 5b, and terminal 4b to contact 5a. This ensures the electrical connection achieved can only have one predefined polarity, advantageously eliminating a potential source of error in analysis of pulse waveforms such as shown in FIG. 5.

Latching clamp 147 of body 140, which during insertion of weapon 1 into receptacle 3 rides over and then catches against tab 148 on weapon 1, provides means for locking weapon 1 in place. Advantageously, the user does not then need to apply constant insertion force on weapon 1 to maintain electrical contact. To release weapon 1 after testing, thumb pressure is applied at recess 149 of clamp 147 to bend clamp 147 away from tab 148, allowing weapon 1 to be pulled out of receptacle 3.

When weapon 1 is inserted into receptacle 3, terminals 4a and 4b are enclosed to protect the user from accidental electric shock as previously described. To verify weapon performance, some manufacturers recommend measurement of peak sparking voltage as developed across a high-impedance probe, with the probe output being observed by means of an oscilloscope. When weapon 1 is discharged for such "open-circuit" performance tests, arcs will periodically occur between terminals 4a and 4b over the duration of the discharge, which is typically 5 seconds. To prevent an increasing concentration of ionized gas in the vicinity of terminals 4a and 4b from adversely affecting observation of the open-circuit potential over the course of the discharge, venting 150, completely perforating body 140 in a region proximal to terminals 4a and 4b, provides ventilation means to allow such disruptive gasses to be exhausted from the interior of receptacle 3.

In the preferred embodiment of the invention, body 140 of receptacle 3 is machined from a block of Delrin® plastic, with recesses 142 and 145 being machined to specifically fit the TASER® X26E Electronic Control Device manufactured by Taser International of Scottsdale Ariz. Thereby, receptacle 3 will accept only X26E, optimally aligning and orienting X26E to achieve a connection having minimum electrical resistance and only one predetermined polarity. Contacts 5a and 5b are machined from brass and placed under tension with springs 143a and 143b formed from modified compression spring #9663K12 by McMaster Carr.

Novel apparatus which allows performance tests of conducted energy weapons to be easily and routinely conducted by peace officers or other non-technical persons has been described. It is evident that given the preceding description of the preferred embodiment, persons skilled in the art may now make numerous uses of, modifications of, and departures from the preferred embodiment of the invention without departing from the principles of the invention. For example, it will be obvious to persons skilled in the art that many permutations of thresholds as exemplified in TABLE II and TABLE III are possible, for example, thresholds which would permit any TASER® X26E satisfying the characteristics listed in TABLE I for all electrical current pulses output over the course of a five-second discharge to produce a "zero risk" indication of injury, or a "zero risk" indication of failure to incapacitate, by means of LCD 33. Furthermore, it will be obvious that alternative characteristic signals can be obtained from electrical current pulses produced by the weapon and risk estimates derived by different analytical techniques than the illustrative embodiment described herein. Depending on design and specifications of the weapon to be tested, it may be possible to derive risk estimates using fewer characteristic signals than those listed in TABLES II and III; as weapon technology improves, or as new scientific evidence related to the effects of electrical stimulation by CEWs on humans is reported, it may become necessary for test apparatus to extract alternative or additional characteristic signals from the electrical current pulses observed. The preferred embodiment, being based on digitization of electrical current pulses and analysis of data by computing means, streamlines adaptation to suit scaled-down test requirements, or increasingly comprehensive test requirements for future weapon technologies. On the other hand, it will be equally obvious to persons skilled in the art that a less complicated and potentially lower-cost embodiment of the invention is possible that extracts specific signal characteristics such as pulse interval, duration, and peak amplitude and compares these to preset thresholds to produce a "red light/green light" indication of risk, and that such apparatus may be embodied without high-speed digitization of the weapon's electrical output or data analysis by sophisticated computing means; however, such a simplified embodiment lies within the scope of the claimed invention. It will be additionally obvious to persons skilled in the art that, with respect to the preferred embodiment of receptacle 3, machining of insulating body 140, recess 141, and recess 145 may be arbitrarily executed and contacts 5a and 5b arbitrarily positioned to suit any specific make or model of weapon, and as such numerous receptacles similar to receptacle 3 as disclosed but differing in specific geometry may be envisioned as part of a working model of the complete apparatus. Therefore, in light of the foregoing and other examples, the invention is not limited to the details given herein, but may be modified within the scope of the appended claims.

We claim:

1. Apparatus for testing a conducted energy weapon, comprising:
   (a) receptacle means for connecting a set of terminals on the conducted energy weapon to a resistive load;
   (b) sensor means for producing a load signal representative of electrical current pulses delivered from the set of terminals to the resistive load when the conducted energy weapon is discharged;
   (c) analyzer means responsive to the load signal for producing a plurality of characteristic signals representative of characteristics of the electrical current pulses;
   (d) risk estimation means responsive to the plurality of characteristic signals for producing a risk estimate representative of an adverse outcome when the conducted energy weapon is discharged; and
   (e) indicator means responsive to the risk estimate for indicating the risk of the adverse outcome.

2. Apparatus as defined in claim 1, wherein the plurality of characteristic signals includes an amplitude signal representative of peak values of the electrical current pulses.

3. Apparatus as defined in claim 1, wherein the plurality of characteristic signals includes a duration signal representative of durations of the electrical current pulses.

4. Apparatus as defined in claim 1, wherein the plurality of characteristic signals includes an instantaneous frequency signal representative of inverted time intervals between the electrical current pulses.

5. Apparatus as defined in claim 1, wherein the plurality of characteristic signals includes a net charge signal representative of net electric charges delivered by the electrical current pulses.

6. Apparatus as defined in claim 1, wherein the adverse outcome is injury to a targeted subject.

7. Apparatus as defined in claim 6, wherein the risk estimation means produces the risk estimate by:
   (a) selecting, from the plurality of characteristic signals, each characteristic signal in turn;
   (b) comparing each characteristic signal to a corresponding set of predetermined thresholds representative of graduated severities of harm due to an electrical stimulation; and
   (c) incrementing the risk estimate in each instance where a characteristic signal exceeds a threshold of the corresponding set of predetermined thresholds.

8. Apparatus as defined in claim 1, wherein the adverse outcome is failure to incapacitate a targeted subject.

9. Apparatus as defined in claim 8, wherein the risk estimation means produces the risk estimate by:
   (a) selecting, from the plurality of characteristic signals, each characteristic signal in turn;
   (b) comparing each characteristic signal to a corresponding set of predetermined thresholds representative of graduated levels of incapacitation due to an electrical stimulation; and
   (c) incrementing the risk estimate in each instance where a characteristic signal falls below a threshold of the corresponding set of predetermined thresholds.

10. Apparatus as defined in claim 1, wherein the indicator means includes decision means for indicating that the risk estimate has exceeded a predetermined threshold.

* * * * *